(12) United States Patent
Kondo et al.

(10) Patent No.: US 6,270,359 B1
(45) Date of Patent: Aug. 7, 2001

(54) ELECTRIC JUNCTION BOX (75) Inventors: Hiroyuki Kondo; Satoshi Ishikawa, both of Shizuoka (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 09/371,502

(22) Filed: Aug. 10, 1999

(30) Foreign Application Priority Data

Aug. 10, 1998 (JP) .................................................. 10-225871

(51) Int. Cl.⁷ ...................................................... H01R 9/09
(52) U.S. Cl. ............................................................ 439/76.2
(58) Field of Search .................................... 439/76.2, 949

(56) References Cited

U.S. PATENT DOCUMENTS 5,764,487 * 6/1998 Natsume .............................. 439/76.2

FOREIGN PATENT DOCUMENTS 9-172720    6/1997 (JP) .

* cited by examiner

Primary Examiner—Neil Abrams
Assistant Examiner—Phuong KT Dinh (74) Attorney, Agent, or Firm—Sughrue, Mion, Zinn, Macpeak & Seas, PLLC (57) ABSTRACT An electric junction box, including an electronic circuit board (7), a bed member (5) and a bus bar wiring board (25), is formed into a simplified, compact construction. The bus bar wiring board (25) and the electronic circuit board (7) are received within a junction box body (2, 3), and the bed member (5) is disposed between the bus bar wiring board (25) and the electronic circuit board (7), and the bus bar wiring board (25) and the electronic circuit board (7) are connected together, and the electric junction box is connected to the exterior through a connector portion (27) of the junction box body (2, 3). First terminals (6) and second terminals (22) are fixedly secured to the bed member (5), and one end portion of each of the first terminals (6), as well as one end portion of each of the second terminals (22), is connected to the electronic circuit board (7), and the other end portion of the first terminal (6) extends through the bus bar wiring board (25) into the connector portion (27), and the other end portion of the second terminal (22) is disposed in a receiving portion (21) formed within the bed member (5), and is connected to a bus bar terminal of the bus bar wiring board (25). The electronic circuit board (7) is fixedly secured to the bed member (5). The bus bar wiring board (25) is disposed close to the connector portion (27).

5 Claims, 7 Drawing Sheets

ELECTRIC JUNCTION BOX

BACKGROUND OF THE INVENTION

1. Field of the Invention

The present invention relates to an electric junction box in which an electronic circuit board and terminals are fixedly secured to a bed member, and the terminals are connected to bus bar terminals of a bus bar wiring board within the bed member.

The present application is based on Japanese Patent Application No. Hei. 10-225871, which is incorporated herein by reference.

2. Description of the Related Art

Figure 6:
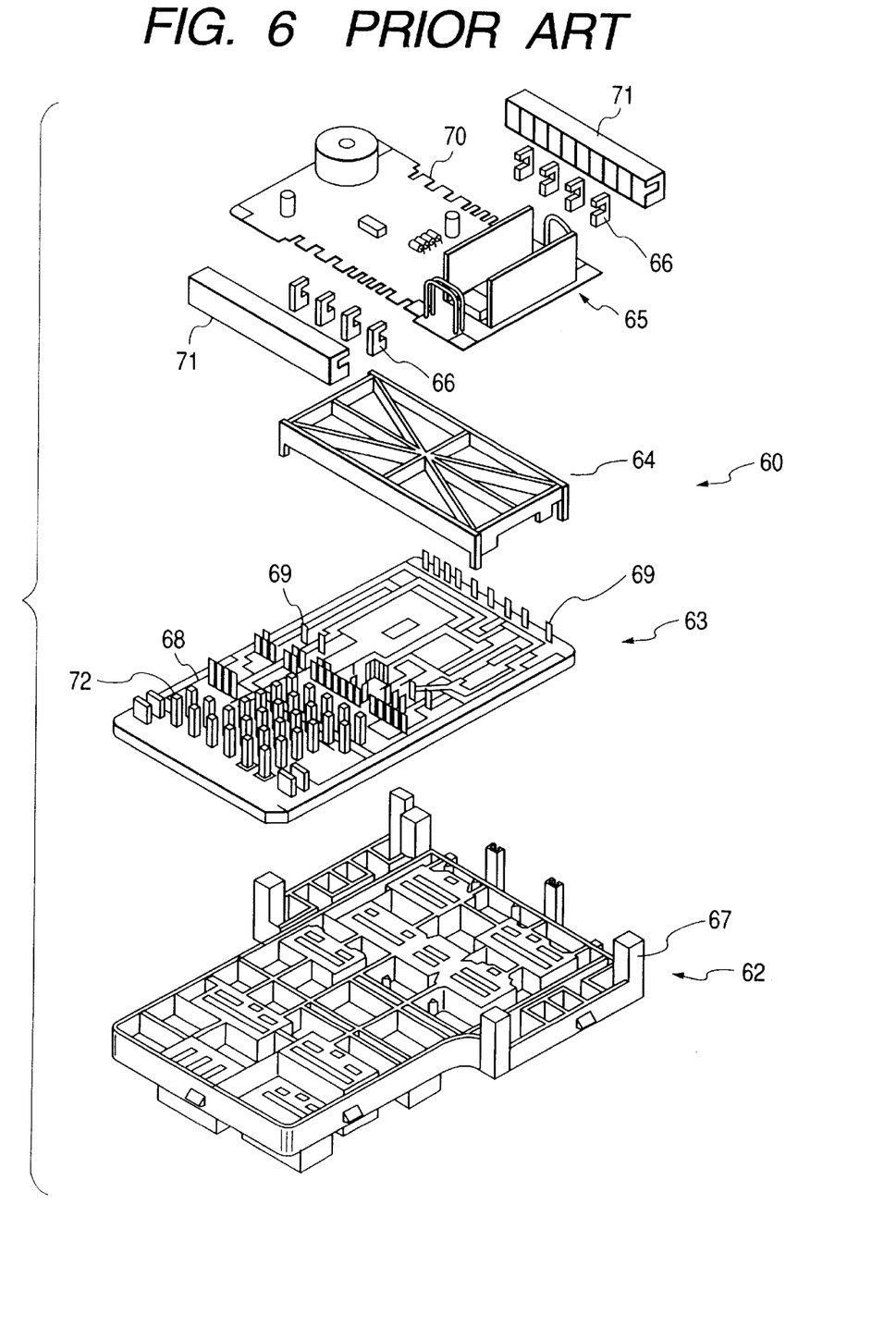
FIG. 6 is an exploded, perspective view showing an internal structure of the related electric junction box.
Figure 7:
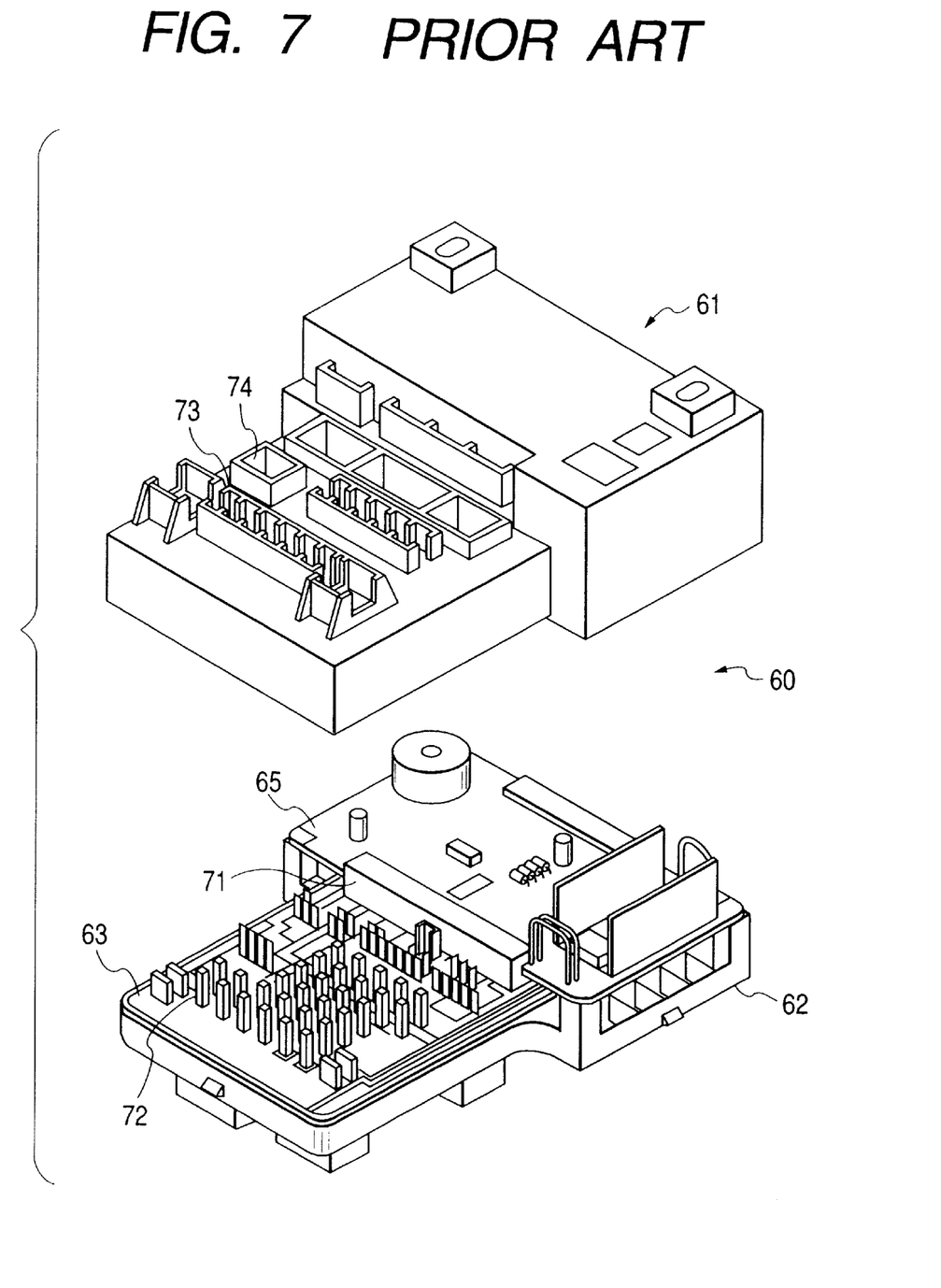
FIG. 7 is an exploded, perspective view showing a condition in which an upper casing is to be mounted on a lower casing assembly.

FIGS. 6 and 7 show the related electric junction box which has been disclosed in Unexamined Japanese Patent Publication No. Hei. 9-172720.

In this electric junction box 60, bus bar wiring boards 63 are provided in a stacked manner between an upper casing 61 (FIG. 7) and a lower casing 62, and an electronic circuit board 65 is mounted on one half portion of the bus bar wiring board 63 through a bed member 64, and the electronic circuit board 65 and the bus bar wiring boards 63 are connected together through relay terminals 66.

Support posts 67 for supporting the electronic circuit board 65 thereon are formed upright on the lower casing 62, and the bus bar wiring boards 63 are received between the opposed support posts 67. A plurality of tab terminals 69 are formed in an upstanding manner on bus bars 68 of the bus bar wiring board 63. A plurality of terminal portions 70, connected to a printed circuit (not shown), are formed at a peripheral portion of the electronic circuit board 65. One contact portion of each relay terminal 66 is connected to the associated terminal portion 70. Each group of relay terminals 66 are received in a housing 71, and in this condition each group of relay terminals 66 are connected to the terminal portions 70 laterally of the electronic circuit board 65. The housings 71 are provided at the opposite side edge portions of the electronic circuit board 65, respectively. The other contact portions of the relay terminals 66 are connected to the tab terminals 69 of the bus bars 68, respectively. The one contact portion of the relay terminal is disposed perpendicular to the other contact portion thereof.

Various parts, including diodes, noise filters, a buzzer for preventing a failure to turn off a light, and a buzzer for preventing a failure to withdraw a key, are mounted on the electronic circuit board 65. Second relay terminals 72, connected to the tab terminals 69 of the bus bars 68 are disposed in a fuse connection cavity 73 of the upper casing 61 (FIG. 7). A wire harness (not shown) is connected from the exterior to a connector portion 74 of the upper casing 61.

In the above construction, however, the connection between the bus bar wiring boards 63 and the electronic circuit board 65 requires many connecting portions, that is, the connection between the terminal portions 70 of the printed circuit and the one contact portions of the relay terminals 66 and the connection between the other contact portions of the relay terminals 66 and the tab terminals 69 of the bus bars 68. Therefore, there have been encountered problems that the number of the component parts is increased, so that the construction is complicated, that much time and labor are required for the connecting and assembling operations, and that the electrical contact resistance is increased. And besides, since the relay terminals 66 have a complicated construction, there has been encountered a problem that the costs of the component parts are high.

There has been encountered a further problem that much time and labor are required for putting the relay terminals 66 into the housings 71. The housings 71 are provided respectively at two sides of the outer peripheral edge of the electronic circuit board 65 (in some cases, these housings are provided respectively at four sides of this outer peripheral edge), and therefore there has been encountered a further problem that the construction becomes complicated and bulky. The terminal portions 70 of the printed circuit must be provided at the outer peripheral edge portion of the electronic circuit board 65, and also the tab terminals 69 of the bus bars 68 must be provided in opposed relation to the outer peripheral edge of the electronic circuit board 65, and therefore there has been encountered a problem that the degree of freedom of the circuit arrangement, as well as the degree of freedom of arrangement of the connecting positions, is limited, so that the construction becomes complicated and bulky. The tab terminals 69 of the bus bars 68 can not be disposed at one half portion of the bus bar wiring board 63 beneath the bed member 64, and therefore there has been encountered a problem that a dead space is formed within the bed member 64, which also makes the electric junction box bulky. The upper surface of the upper casing 61 is stepped so that the electronic circuit board 65 can be disposed at a level higher than the bus bar wiring board 63, and this has invited a problem that the configuration is limited.

SUMMARY OF THE INVENTION

With the above problems in view, it is an object of the present invention to provide an electric junction box in which the structure for connecting a bus bar wiring board and an electronic circuit board together is simplified, and has a compact and low-cost design, and an connecting operation is simplified, and the reliability of electrical connection is enhanced with a reduced number of contact portions (contacts), and the degree of freedom of a circuit arrangement, as well as the degree of freedom of arrangement of the connecting positions, is increased.

To achieve the above object, according to the present invention, there is provided an electric junction box which comprises a junction box body including a connector portion, a bus bar wiring board received within the junction box body, the bus bar wiring board including a bus bar terminal, an electronic circuit board received within the junction box body, a bed member disposed between the bus bar wiring board and the electronic circuit board, the bed member including a receiving portion formed therein, at least one first terminal fixedly secured to the bed member, one end portion of the first terminal being electrically connected to the electronic circuit board, and the other end portion of the first terminal extending through the bus bar wiring board into the connector portion, and at least one second terminal fixedly secured to the bed member, one end portion of the second terminal being electrically connected to the electronic circuit board, and the other end portion of the second terminal being disposed in the receiving portion of the bed member and electrically connected to the bus bar terminal of the bus bar wiring board.

Preferably, the electronic circuit board is fixedly secured to the bed member.

Preferably, the bus bar wiring board is disposed close to the connector portion.

Preferably, the electric junction box is an electric junction box electrically connected to exterior through the connector portion of the junction box body.

DETAILED DESCRIPTION OF THE PREFERRED EMBODIMENT

A preferred embodiment of the present invention will now be described in detail with reference to FIGS. 1 to 5.

FIGS. 1 to 5 shows one preferred embodiment of an electric junction box of the present invention.

Figure 1:
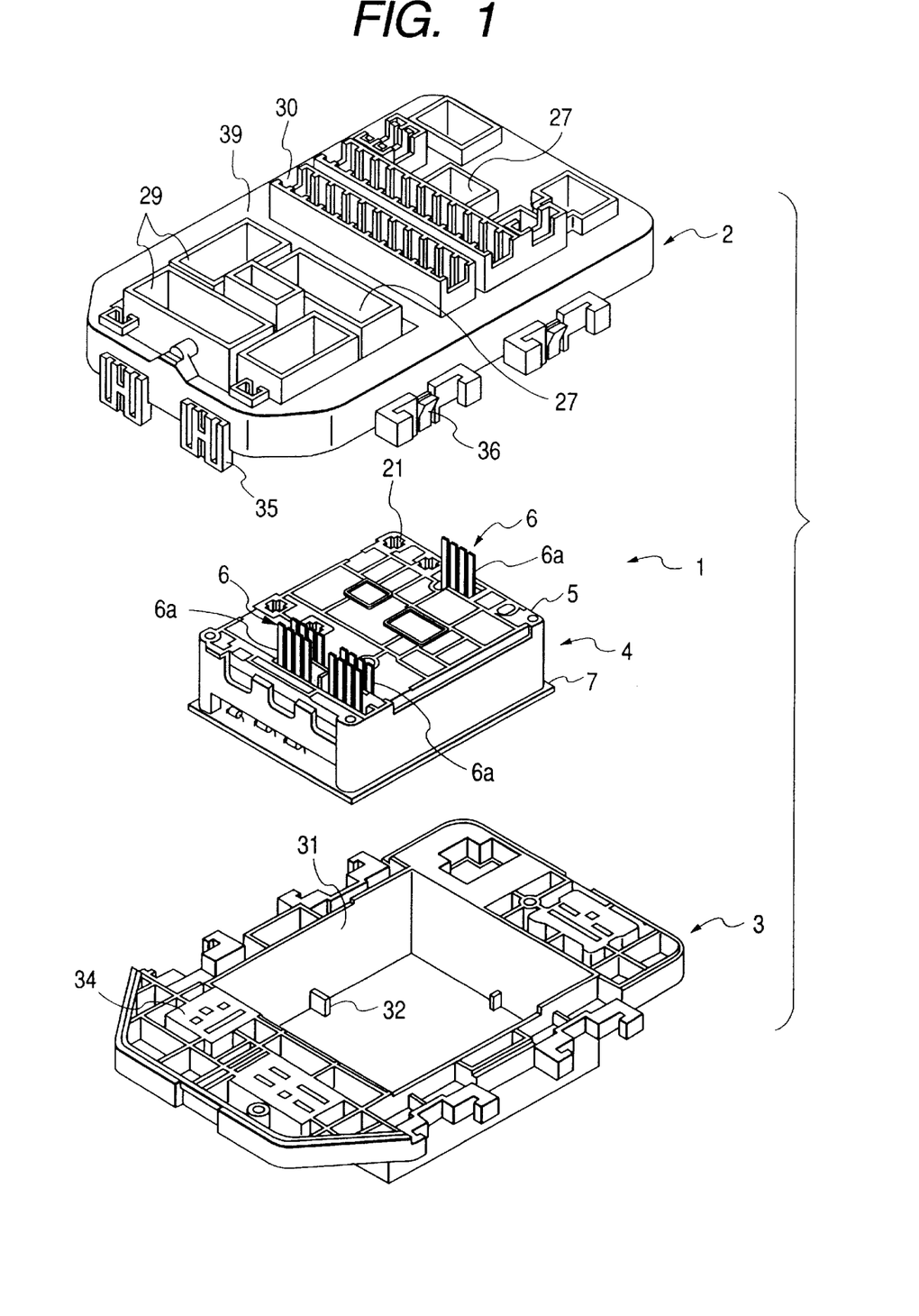
FIG. 1 is an exploded, perspective view of one preferred embodiment of an electric junction box of the present invention.

As shown in FIG. 1, the electric junction box 1 comprises upper and lower casings 2 and 3 each made of a synthetic resin, and a bed-circuit assembly 4 provided between the two casings 2 and 3 (forming a junction box body).

Figure 2:
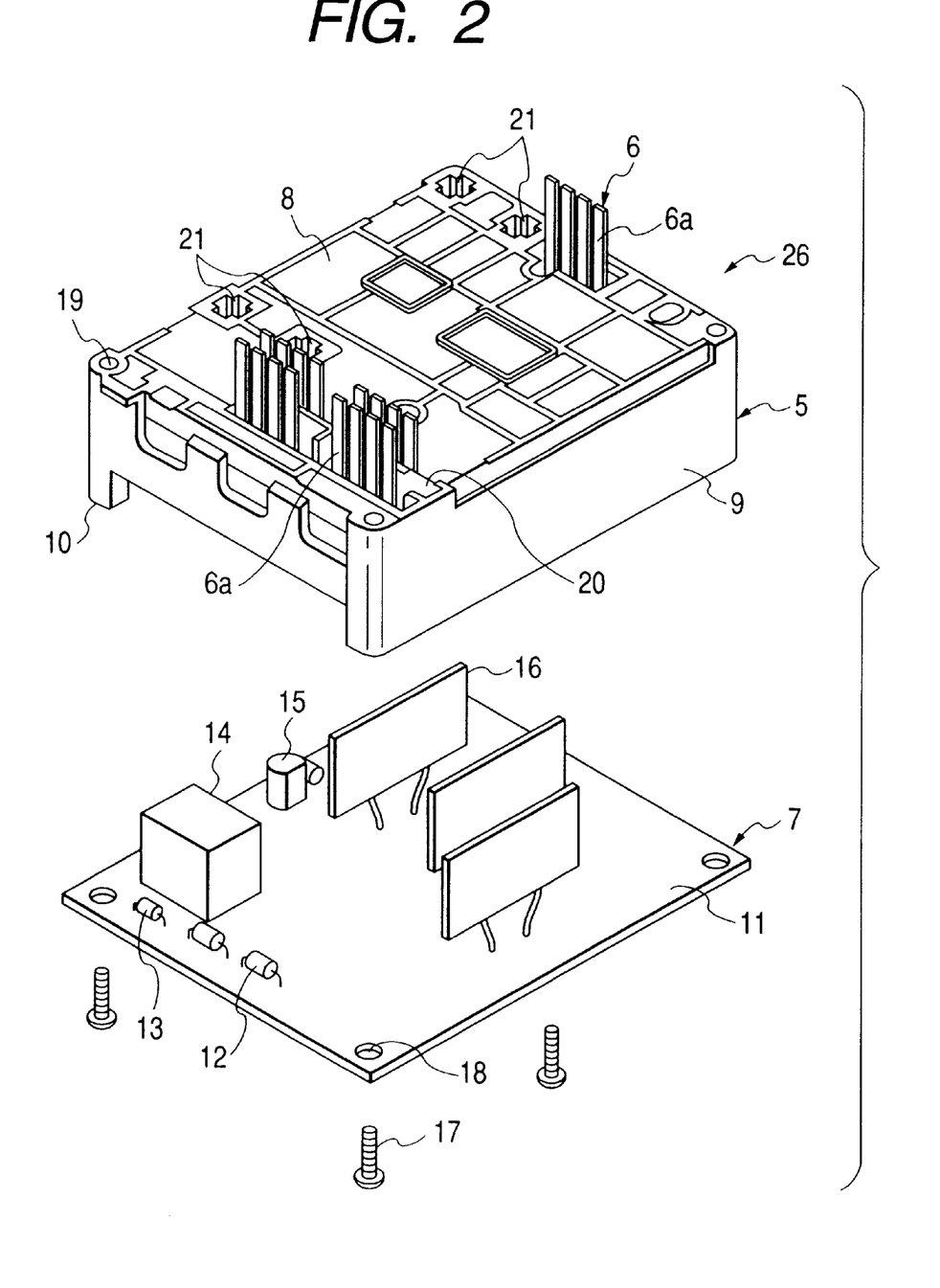
FIG. 2 is an exploded, perspective view of a bed-circuit assembly to be received within the electric junction box.

As shown in FIG. 2, the bed-circuit assembly 4 comprises a bed member 5 made of an insulative synthetic resin, a plurality of first terminals 6 (FIG. 4) of a tab-like shape each fixedly secured to the bed member 5 in a press-fitted manner, with its one tab portion (one end portion) 6a projecting upwardly, and an electronic circuit board 7 which is secured to a lower end of the bed member 5, and is connected to connecting portions (the other ends) 6c (FIG. 4) of the first terminals 6. The bed member 5 of an integral construction includes an upper wall 8, a peripheral wall 9, defining front, rear, right and left side surfaces, and support posts (legs) 10.

Figure 4:
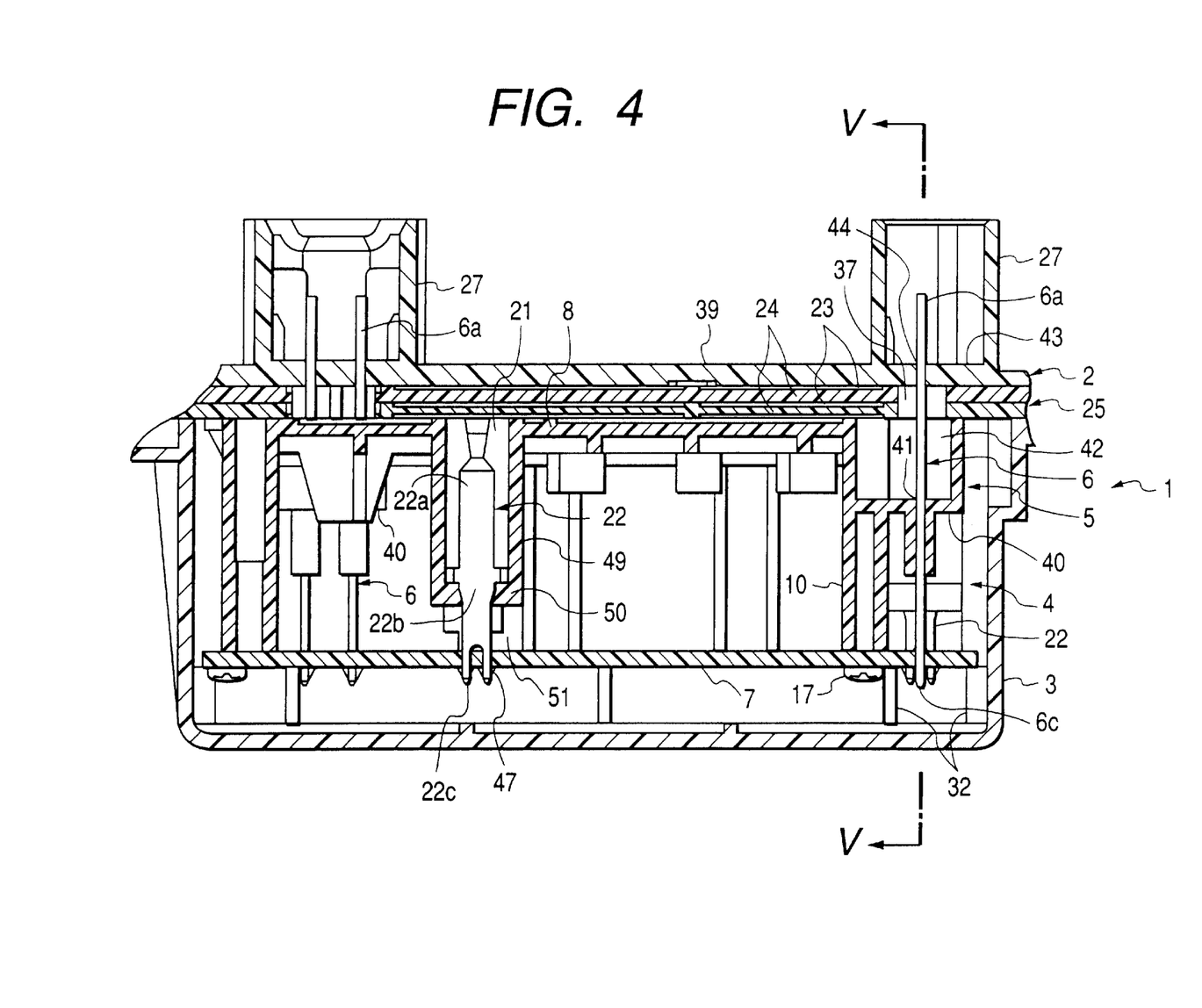
FIG. 4 is a vertical cross-sectional view of the electric junction box in its assembled condition.

The electronic circuit board 7 comprises an insulating board 11 on which a printed circuit (not shown) is formed in a predetermined pattern, and electronic parts, including diodes 12, resistors 13, a relay 14, a capacitor 15 and thermistors 16, are connected by soldering to this printed circuit. The electronic circuit board 7 is fixedly secured to the bed member 5 by small screws 17. Reference numeral 18 denotes a screw insertion hole, and a hole 19, formed in each support post 10 of the bed member 5, has internal threads. The tab portions 6a of the first terminals 6 are provided in a recess 20 in the upper wall 8 of the bed member 5, and project upwardly toward the upper casing 2. Cavities 21 are formed respectively in predetermined portions of the upper wall 8 of the bed member 5, and second terminals 22 (FIG. 4) project into the cavities 21, respectively. The second terminals 22 are connected to bus bars 23 (FIG. 4). The bed member 5 and the first and second terminals 6 and 22 jointly form a bed subassembly 26.

In FIG. 1, the upper casing 2 includes connector portions 27 for receiving the tab portions 6a of the first terminals 6, connector portions 29 for receiving bus bar terminals 28 of bus bar wiring boards 25 (FIG. 3), and fuse connection cavities 30. The lower casing 3 has a receiving recess 31 for receiving the bed-circuit assembly 4. The lower casing 3 has ribs 32 for supporting the electronic circuit board 7. The lower casing 3 also has connector portions 34 through which tab terminals 33 of the bus bar wiring boards 25 (FIG. 3) extend. The upper and lower casings 2 and 3 are fixedly connected together by retaining portions 35, and this junction box is fastened to a bracket (not shown) on a vehicle body.

Figure 3:
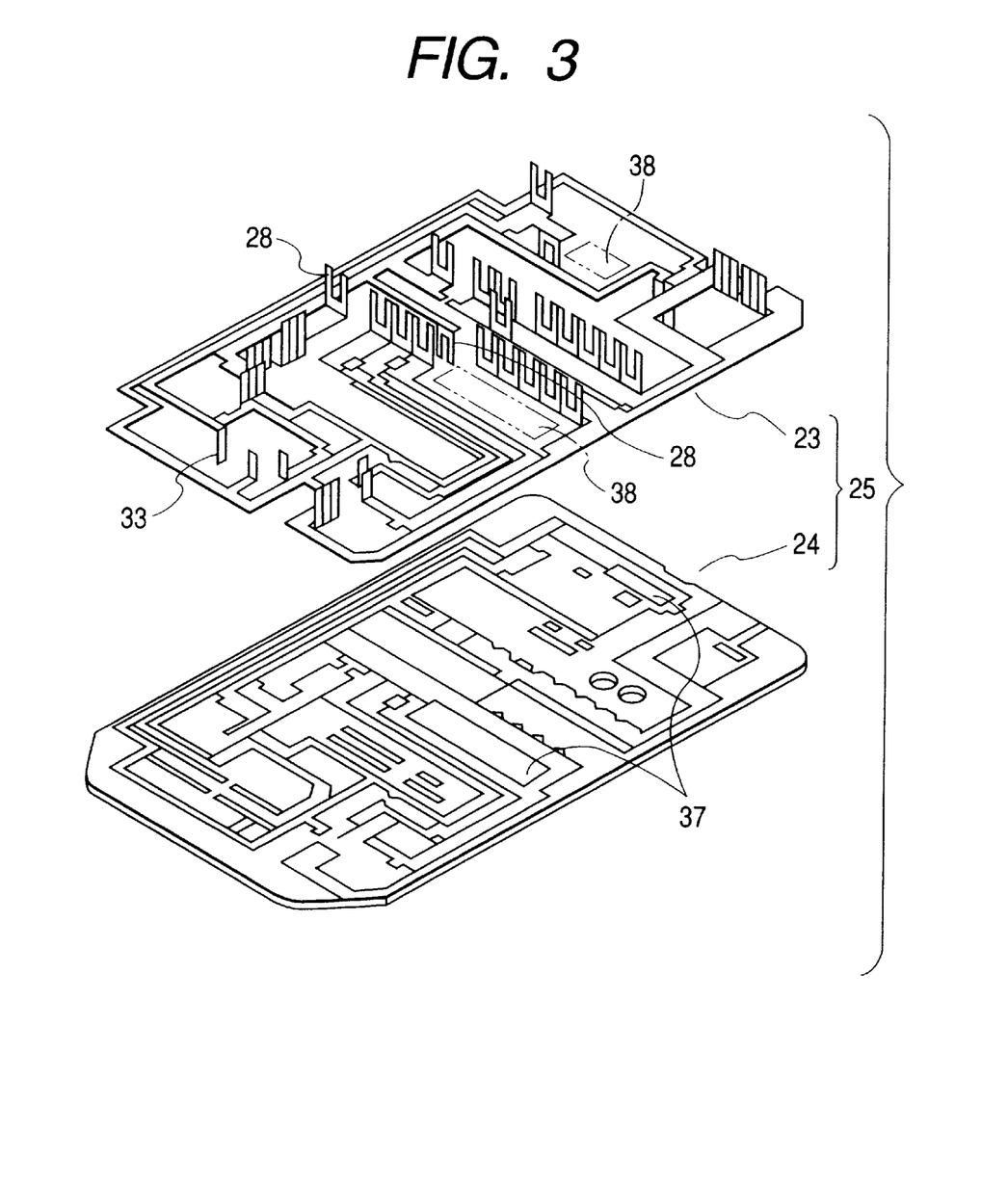
FIG. 3 is an exploded, perspective view of a bus bar wiring board to be received within the electric junction box.

The bus bar wiring board 25, as shown in FIG. 3, is provided between the upper casing 2 and the bed-circuit assembly 4. The bus bar wiring board 25 comprises an insulating board 24, and the bus bars 23. Insertion holes (openings) 37 for the tab portions 6a of the first terminals 6 of the bed-circuit assembly 4 (FIG. 1) are formed through the insulating board 24. The holding terminals (bus bar terminals) 28 of the tuning fork-type and the tab terminals 33 extend upwardly and downwardly from the bus bars 23. The tab portions 6a of the first terminals 6 (FIG. 1) are disposed in spaces 38 (indicated in dot-and-dash lines) between the bus bars 23.

Figure 5:
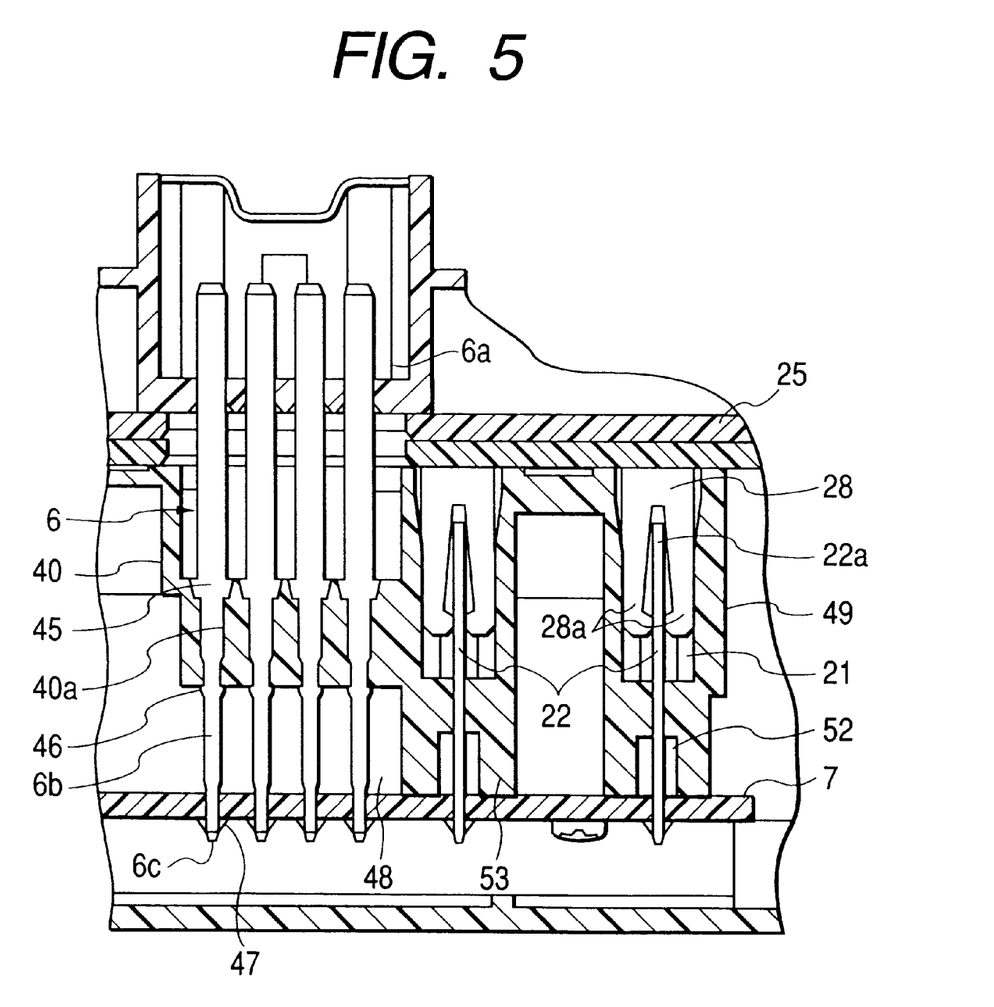
FIG. 5 is a cross-sectional view taken along the line V—V of FIG. 4.

In an assembled condition of the electric junction box 1 shown in FIGS. 4 and 5, the bus bar wiring boards 25 are stacked together on the bed-circuit assembly 4, and an upper wall 39 of the upper casing 2 is disposed on the bus bar wiring board 25. The electronic circuit board 7 is fixedly secured to the support posts 10 of the bed member 5 by the small screws 17, and is placed on the ribs 32 of the lower casing 3.

First block portions 40 of a rectangular pillar-shape are formed integrally within the bed member 5, and central portions of the first terminals 6 are press-fitted respectively in slit-like holes 41 in the first block portions 40, and hence are fixed thereto. The first terminals 6 may be fixed to the first block portions 40 by insert molding. A cavity (recess) 42 is formed in the first block portion 40, and receives the proximal end portions of the tab portions 6a so as to absorb misregistration and deflection of the tab portions 6a. The first block portions 40 are stably supported relative to the electronic circuit board 7 by the support posts 10 and so on.

The tab portions (upper half portions) 6a of the first terminals 6 extend through the associated hole 37 (formed through the insulating board 24) into the associated connector portion 27 of the upper casing 2. Insertion holes 44 for the tab portions 6a are formed through a bottom wall 43 of the connector portion 27. The bus bar wiring boards 25 are held between the upper casing 2 and the bed member 5.

As shown in FIG. 5, the lower half portion of the first terminal 6 is narrower than the tab portion 6a, and projections 45 for stopping the press-fitting of the first terminal relative to a solid portion 40a of the first block portion 40 are formed respectively on opposite sides of this narrower portion 6b, and also retaining projections 46 are formed respectively on the opposite sides of the narrower portion 6b. The projections 45 are spaced from the projections 46 along the length of the first terminal 6. The second terminal 22 has a similar construction. The pin-like connecting portion 6c is formed at the distal end of the narrower portion 6b, and extends through the electronic circuit board 7, and is connected to the printed circuit (not shown) by solder 47. The narrower portions 6b of the first terminals 6 are exposed to a space 48 between the first block portion 40 and the electronic circuit board 7 so as to absorb misregistration and thermal strain of the narrower portions 6b.

In FIGS. 4 and 5, second block portions 49 of a rectangular pillar-shape for fixing the second terminals 22 are formed integrally on the bed member 5, the second block portion 49 being separate from or integral with the block portion 40 for fixing the first terminals 6. The second block portion 49 has the cavity (receiving portion) 21 extending downwardly from the upper wall 8, and a central portion 22b of the second terminal 22 is fixed to a bottom wall 50 of the cavity 21 in a press-fitted manner, and a tab portion (upper half portion) 22a of the second terminal 22 projects into the cavity 21. A space 51 or a cavity 52 is formed beneath the bottom wall 50, and a slightly-narrower lower half portion of the second terminal 22 extends through the space 51 or the cavity 52, and a connecting portion 22c at the distal end thereof extends through the electronic circuit board 7, and is connected to the printed circuit (not shown) by solder 47. The second block portions 49 are stably supported relative to the electronic circuit board 7 by legs 53 and so on.

The downwardly-directed holding terminal (bus bar terminal) 28 of the bus bar 23 is inserted into the cavity 21 in the second block portion 49, and is connected to the second terminal 22 in perpendicularly-intersecting relation thereto. The holding terminal 28 has a pair of holding tongues 28a, and is connected to the second terminal 22 in such a manner that the pair of holding tongues 28a hold the tab portion 22a of the second terminal 22 therebetween in the direction of the thickness of the tab portion 22a.

The bus bar wiring boards 25 are thus connected to the electronic circuit board 7 through the holding terminals 28 of the bus bars 23 and the second terminals 22, and the electronic circuit board 7 is connected to connectors of external wire harnesses (not shown) through the first terminals 6.

In the above embodiment, the holding terminals 28 are integral with the bus bar 23, and therefore the electrical contact resistance is zero, and as compared with the related construction in the background section, employing the relay terminals, there is no electrical loss, and number of contacts is smaller. Unlike the related relay terminals described in the background section, the first and second terminals 6 and 22 can be provided at desired portions of the electronic circuit board 7, and therefore the length of arrangement of the bus bars 23, as well as the length of arrangement of the circuit pattern, is not increased, and therefore the construction is simplified and compact. The bus bar wiring boards 25 are disposed immediately below the upper casing 2, and the first and second terminals 6 and 22 project through the bus bar wiring boards 25 toward the upper casing 2, and therefore there is no need to provide the electronic circuit board 7 at an upwardly-spaced position as in the related construction shown in FIG. 7, and the upper wall 39 of the upper casing 2, having the cavities 30 and the connector portions 27 and 29, is not stepped but is flat, thus providing the simplified configuration. The second terminals 22 are received within the bed member 5, and are connected to the respective holding terminals 28 of the bus bars 23 within the bed member 5. Also, the various electronic parts 12 through 16 on the electronic circuit board 7 are disposed in the internal space of the bed member 5, and the internal space of the bed member 5 is thus efficiently utilized, and the main portions necessary for the connection are received in a concentrated manner within the bed member 5, and therefore the compact construction is achieved.

As described above, in the present invention, the first and second terminals are fixedly secured to the bed member, and the first terminals extend through the bed member, and the second terminals are received within the bed, and are connected to the bus bar terminals within the bed member. Therefore, the internal space of the bed member is efficiently used, and the compact construction is achieved. The bus bar terminals are connected directly to the second terminals without the use of the related relay terminals and housing as described in the background section, and therefore the number of the contacts is reduced, thereby enhancing the reliability of the electrical connection, and the construction is simplified, and the costs of the parts are reduced, and the connecting operation is simplified. The first and second terminals can be provided at desired portions of the bed member, and therefore the degree of freedom of arrangement of the connecting positions, the degree of freedom of the circuit arrangement, and the degree of freedom of arrangement of the parts are increased, and this also enables the simplified, compact construction. In the present invention, the bed member, the first and second terminals and the electronic circuit board are assembled together, and thereafter this assembly can be mounted on the connector box body, and therefore the efficiency of the assembling operation is enhanced. In the present invention, the bus bar terminals of the bus bar wiring board can be projected from the outer surface of the junction box body without interference with the electronic circuit board, and therefore the degree of freedom of arrangement of the bus bar terminals, the degree of freedom of arrangement of the bus bars, and the degree of freedom of the configuration of the junction box body are increased.

What is claimed is:

1. An electric junction box, comprising:
   a junction box body including a connector portion;
   a bus bar wiring board received within the junction box body, the bus bar wiring board including a bus bar terminal;
   an electronic circuit board received within the junction box body;
   a bed member disposed between the bus bar wiring board and the electronic circuit board, the bed member including a receiving portion formed therein;
   at least one first terminal fixedly secured to the bed member, one end portion of the first terminal being electrically connected to the electronic circuit board, and the other end portion of the first terminal extending through the bus bar wiring board into the connector portion; and
   at least one second terminal fixedly secured to the bed member, one end portion of the second terminal being electrically connected to the electronic circuit board, and the other end portion of the second terminal being disposed in the receiving portion of the bed member and electrically connected to the bus bar terminal of the bus bar wiring board.

2. The electric junction box of claim 1, wherein the electronic circuit board is fixedly secured to the bed member.

3. The electric junction box of claim 1, wherein the bus bar wiring board is disposed substantially near the connector portion.

4. The electric junction box of claim 2, wherein the bus bar wiring board is disposed substantially near the connector portion.

5. The electric junction box of claim 1, wherein the electric junction box is electrically connected to an exterior through the connector portion of the junction box body.

\* \* \* \* \*